United States Patent
Buchanan et al.

(10) Patent No.: US 6,566,281 B1
(45) Date of Patent: *May 20, 2003

(54) NITROGEN-RICH BARRIER LAYER AND STRUCTURES FORMED

(75) Inventors: Douglas Andrew Buchanan, Cortlandt Manor, NY (US); Matthew Warren Copel, Yorktown Heights, NY (US); Fenton Read McFeely, Ossining, NY (US); Patrick Ronald Varekamp, Croton-on-Hudson, NY (US); Mark Monroe Banaszak Holl, Ann Arbor, MI (US); Kyle Erik Litz, Ann Arbor, MI (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/982,150

(22) Filed: Dec. 1, 1997

Related U.S. Application Data

(60) Provisional application No. 60/062,424, filed on Oct. 15, 1997.

(51) Int. Cl.$^7$ .................. H01L 21/31; H01L 21/469
(52) U.S. Cl. .................. 438/786; 438/624; 438/778; 438/787; 438/791
(58) Field of Search .................. 438/758, 791, 438/769, 775, 786, 624, 770, 778, 787

(56) References Cited

U.S. PATENT DOCUMENTS

| | | | | |
|---|---|---|---|---|
| 3,637,423 A | * | 1/1972 | Sestrich | 427/113 |
| 4,089,992 A | * | 5/1978 | Doo et al. | 438/542 |
| 4,200,666 A | * | 4/1980 | Reinberg | 427/579 |
| 4,395,438 A | * | 7/1983 | Chiang | 438/791 |
| 4,618,541 A | * | 10/1986 | Forouhi et al. | 257/640 |
| 4,720,395 A | * | 1/1988 | Foster | 427/162 |
| 4,980,307 A | * | 12/1990 | Ito et al. | 438/591 |
| 5,578,530 A | * | 11/1996 | Muroyama et al. | 438/791 |
| 5,663,087 A | * | 9/1997 | Yokozawa | 438/762 |
| 5,710,067 A | * | 1/1998 | Foote et al. | 438/636 |
| 5,712,208 A | * | 1/1998 | Tseng et al. | 438/770 |
| 5,750,436 A | * | 5/1998 | Yamaga et al. | 438/791 |
| 5,756,404 A | * | 5/1998 | Friedenreich et al. | 438/791 |
| 5,899,750 A | * | 5/1999 | Tanaka et al. | 438/753 |
| 5,907,382 A | * | 5/1999 | Kajiura et al. | 349/158 |
| 5,939,763 A | * | 8/1999 | Hao et al. | 257/411 |

OTHER PUBLICATIONS

Hosoya et al. "A Polycide Gate Electrode with a Conductive Diddusion Barrier Formed with ECR Nitrogen Plasma for Dual Gate CMOS", IEEE, pp. 2111–2116, Dec. 1995.*

* cited by examiner

Primary Examiner—Amir Zarabian
Assistant Examiner—Maria Guerrero
(74) Attorney, Agent, or Firm—Robert M. Trapp; Randy W. Tung

(57) ABSTRACT

The present invention discloses a method for forming a layer of nitrogen and silicon containing material on a substrate by first providing a heated substrate and then flowing a gas which has silicon and nitrogen atoms but no carbon atoms in the same molecule over said heated substrate at a pressure of not higher than 500 Torr, such that a layer of nitrogen and silicon containing material is formed on the surface. The present invention is further directed to a composite structure that includes a substrate and a layer of material containing nitrogen and silicon but not carbon overlying the substrate for stopping chemical species from reaching the substrate. The present invention is further directed to a structure that includes a semiconducting substrate, a gate insulator on the substrate, a nitrogen-rich layer on top of the gate insulator, and a gate electrode on the nitrogen-rich layer, wherein the nitrogen-rich layer blocks diffusion of contaminating species from the gate electrode to the gate insulator.

27 Claims, 3 Drawing Sheets

NITROGEN-RICH BARRIER LAYER AND STRUCTURES FORMED

CROSS-REFERENCE TO RELATED APPLICATION

The present application claims priority to co-pending U.S. provisional application Ser. No. 60/062,424 filed Oct. 15th 1997.

FIELD OF THE INVENTION

The present invention generally relates to a method for forming a layer of nitrogen and silicon containing material on a substrate and more particularly, relates to a method for forming a layer of nitrogen and silicon containing material on a substrate by flowing a gas which has silicon and nitrogen atoms in the same molecule over a heated substrate at a pressure of less than 500 Torr wherein the molecules do not contain carbon.

BACKGROUND OF THE INVENTION

In the recent advancement in semiconductor fabrication technologies, semiconductor devices are continuously being made smaller such that a larger number of devices can be packaged on the same chip real estate. The continuing miniaturization of devices, such as very large scale integrated (VLSI) and ultra large scale integrated (ULSI) devices, demands that each component must be reduced in dimensions. For instance, as the lateral dimensions of a semiconductor device are reduced, the thickness of each of the component layers such as an insulating layer or a conducting layer must be reduced accordingly. As the characteristic dimensions of complementary metal oxide semiconductor (CMOS) technology decrease, more stringent demands are being placed on the silicon dioxide gate insulator layer in the field effect transistor. In addition to its normal function as a circuit element in the device, the gate insulator layer must also protect the silicon substrate from possible diffusion of chemical species originating from a polysilicon gate electrode through the gate insulator/silicon substrate interface. Such chemical species include dopant atoms such as boron which can diffuse from the gate electrode through the gate insulator into the silicon substrate and thus, result in a device that no longer performs within specification. Another chemical species, hydrogen, which is normally present in the gate electrode, is also highly mobile and can react at the silicon substrate/gate insulator interface during the operation of the device. Such reaction may result in a degradation of the gate insulating layer leading to a reduced lifetime of the device. Traditionally, as long as the gate insulating layer is sufficiently thick, the layer serves to protect the substrate from the diffusive chemical species. However, with the thickness of gate insulators in modern ULSI devices shrinking to dimensions of 3 nm or less, the protection of the substrate is no longer assured. Other remedies must be provided for such devices in order to guarantee the fabrication of a transistor that operatesment.

Different ways to increase the chemical isolation provided by a thin gate insulator in a modern semiconductor device have been proposed by others. One of the methods for suppressing diffusive chemical species from the gate electrode is to introduce a very small amount of nitrogen into the silicon dioxide normally used as the gate insulator. Nitrogen acts as a barrier to a number of elemental species such as B, H, and alkali metals such as Li, Na, K, etc. Traditionally, small amounts of nitrogen can be incorporated into silicon dioxide in an uncontrolled manner, i.e., through high temperature annealing of the oxide in a nitrogen-containing gas such as NO, $N_2O$ or $NH_3$. The high temperature required for the annealing process is normally greater than 800° C. A nitrided oxide is thus formed which has been shown to slightly suppress boron penetration and improve hot carrier reliability.

It is known that the optimal nitrogen concentration and distribution in the oxide required to maximize both the suppression of boron penetration and the improvement of hot carrier reliability is different. For instance, to improve the hot carrier reliability, the introduction of a small amount, i.e., <2 atomic %, of nitrogen near the substrate/insulator interface is required. The amount of nitrogen at the interface cannot exceed 2 atomic %, however, without adversely affecting the device characteristics. On the other hand, the ability to suppress boron penetration is directly proportional to the total nitrogen concentration and as such, the amount of nitrogen should be as large as possible. This presents a direct conflict with the effort of improving the hot carrier reliability of the device.

Furthermore, even though the distribution of nitrogen atoms within the oxide is not important with regard to the suppression of boron diffusion, it is desirable to keep boron atoms as far away from the substrate interface as possible. By utilizing the conventional high temperature nitridation annealing process, nitrided oxides with optimal nitrogen content at the substrate/dielectric interface and maximum hot carrier reliability can be obtained. However, there are no existing methods that will also produce a high concentration of nitrogen at the electrode/dielectric interface. As a result, it is presently not possible to simultaneously optimize the hot carrier reliability and the suppression of boron penetration.

As the gate dielectric layer becomes thinner, i.e., when the oxide layer is thinner than 30 Å, another undesirable effect of a large increase in electron tunneling can cause degradation of the oxide and reduced lifetime. It is therefore desirable to provide a barrier layer for blocking hydrogen from attacking the oxide layer when the oxide layer is less than approximately 30 Å. The barrier layer should be advantageously positioned in between the gate dielectric and the gate electrode. The small amount of nitrogen that is incorporated into the oxide via the conventional nitridation annealing method will not act as a significant barrier to hydrogen diffusion from the gate electrode.

It is therefore an object of the present invention to provide a method for forming a layer of nitrogen and silicon containing material on a substrate that does not have the drawbacks nor shortcomings of the conventional high temperature nitridation annealing method.

It is another object of the present invention to provide a method for forming a layer of nitrogen and silicon containing material on a substrate wherein the substrate is maintained at a temperature of not less than 400° C. to enable a pyrolysis reaction.

It is a further object of the present invention to provide a method for forming a layer of nitrogen and silicon containing material on a substrate by first heating the substrate and then flowing a gas which has silicon and nitrogen atoms in the same molecule over the surface of the substrate.

It is another object of the present invention to provide a method for depositing a layer of nitrogen and silicon containing material on a substrate wherein trisilylamine vapor $[(SiH_3)_3N]$ is flowed over a heated substrate.

It is still another object of the present invention to provide a composite structure which includes a substrate and a layer of material containing nitrogen and silicon without carbon overlying the substrate for stopping chemical species from reaching the substrate.

It is yet another object of the present invention to provide a composite structure that includes a substrate, a nitrided oxide layer on the substrate and a layer of nitrogen and silicon containing material on top of the nitrided oxide layer for stopping chemical species from diffusing to said substrate.

It is still another object of the present invention to provide a semiconductor structure that includes a nitrogen-rich layer between a gate electrode and a gate insulator on a semiconducting substrate wherein the nitrogen-rich layer blocks diffusion of chemical species from the gate electrode to the gate insulator.

It is yet another object of the present invention to provide a semiconductor structure that includes a semiconducting substrate, with a gate insulator which may include a nitrided oxide layer, a nitrogen-rich layer and a gate electrode sequentially deposited or grown on the semiconducting substrate such that the diffusion of chemical species from the gate electrode to the gate insulator is inhibited.

SUMMARY OF THE INVENTION

The present invention discloses a method for forming a layer of nitrogen and silicon containing material on a substrate by flowing a gas which has silicon and nitrogen atoms in the same molecule over the surface of a heated substrate wherein the molecules do no contain carbon such that the layer of nitrogen and silicon containing material formed will stop diffusing species from reaching the substrate.

In a preferred embodiment, a method for forming a layer of nitrogen-containing material on a substrate can be carried out by the operating steps of first providing a substrate, then heating the substrate to a temperature of not less than 400° C., and then flowing one or more gases one of which includes nitrogen-containing molecules over a surface of the substrate at a sub-atmospheric pressure. The nitrogen-containing molecules do not contain carbon. The gas can be flowed over the surface of the substrate at a pressure between about 1 m Torr and about 500 Torr, while the surface of the substrate can be maintained at a temperature between about 400° C. and about 900° C. The nitrogen-containing molecules pyrolize and react at the surface to form the layer of nitrogen-containing material. The process can be advantageously carried out in a chemical vapor deposition chamber, wherein the gases flowed therethrough can be selected from the group consisting of $(SiH_3)_3N$, $SiH_4$, $Si_2H_6$, $Si_2H_2Cl_2$, $NH_3$, $NO$, $N_2O$, $N_2H_4$ and $O_2$.

In another preferred embodiment, a method for forming a layer of nitrogen and silicon containing material on a substrate can be carried out by the operating steps of first providing a substrate that is maintained at a temperature of not less than 400° C., and then flowing a gas which has silicon and nitrogen atoms in the same molecule but with no carbon atoms in the molecule over the surface of the substrate at a pressure of not higher than 500 Torr.

The present invention is further directed to a composite structure which includes a substrate and a layer of material containing nitrogen and silicon without carbon overlying the substrate for stopping chemical species from reaching the substrate. The composite structure may further include a nitrided oxide layer that has a thickness of less than 10 nm deposited or grown between the substrate and the layer of material containing nitrogen and silicon. The layer of material containing nitrogen and silicon but not carbon may be stoichiometric nitride. The substrate in the composite structure may be selected from the group consisting of crystalline silicon, polycrystalline silicon, amorphous silicon, silicon germanium alloy, silicon dioxide or any other dielectric materials and substrates covered with a dielectric material. When the substrate is a gate insulator, the composite structure can be positioned with the layer of material containing nitrogen and silicon in intimate contact with a gate electrode layer. The composite structure may further be advantageously used in a CMOS device.

The present invention is further directed to a semiconductor structure that includes a semiconducting substrate, a gate insulator on the substrate, a nitrogen-rich layer on top of the gate insulator and a gate electrode on the nitrogen-rich layer, whereby the nitrogen-rich layer blocks diffusion of chemical species from the gate electrode to the gate insulator. The nitrogen-rich layer in the semiconductor structure may be a material containing nitrogen and silicon but not carbon. The semiconductor structure may further include a nitrided oxide layer placed between the substrate and the gate insulator. The nitrided oxide layer may have a thickness of less than 10 nm, while the nitrogen-rich layer may be a stoichiometric nitride. The nitrogen-rich layer may contain at least 20 atomic % of nitrogen and have a thickness of at least 5 Å.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND THE ALTERNATE EMBODIMENTS

The present invention discloses a method for forming a layer of nitrogen and silicon containing material on a substrate by first heating the substrate to a temperature of at least 400° C. and then flowing a gas which has silicon and nitrogen atoms in the same molecule over the heated substrate at a pressure of not higher than 500 Torr, wherein the molecules do not contain carbon such that the layer of nitrogen and silicon containing material formed is a diffusion barrier layer on the surface of the substrate.

Figure 1:
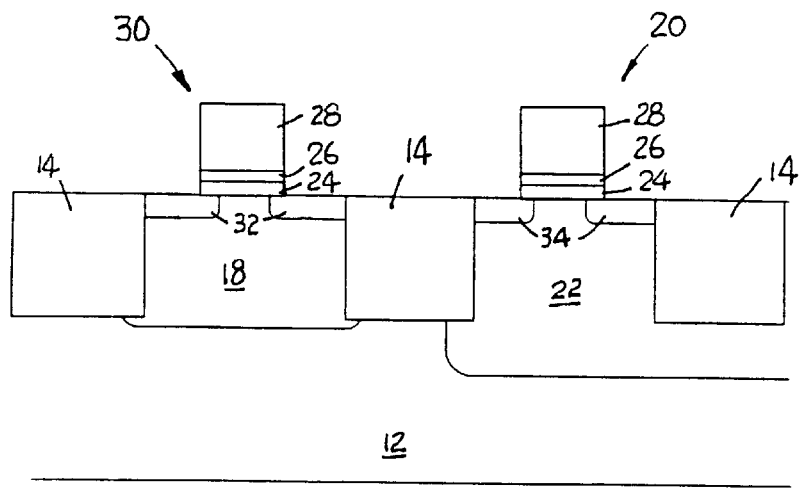
FIG. 1 is an enlarged, cross-sectional view of a semiconductor structure utilizing the present invention novel nitrogen-rich diffusion barrier layer.

The present invention novel structure that has a nitrogen-rich barrier layer can be advantageously used in a semiconductor structure such as that shown in FIG. 1. A preferred embodiment of the present invention structure 10 is shown in FIG. 1 in a CMOS transistor pair. The present invention novel structure 10 is built on a substrate 12 which can be P-type crystalline silicon into which trenches 14 are first formed. An insulating material such as silicon dioxide is then used to fill the trenches 14, in order to provide isolation between the two transistors, i.e., a p-FET (field effect transistor) 20 and an n-FET 30. The substrate 12 is then doped by an ion implantation method to create a deep implanted area of p-type silicon 18 and n-type silicon 22. An insulating layer 24 is then formed on the surface of the substrate 12. The insulating layer 24 is normally formed of silicon dioxide or any other suitable dielectric material. A nitrogen-rich layer 26 is then deposited followed by the deposition of a conducting gate electrode layer 28. The conducting gate electrode layer 28 is normally composed of polysilicon. The insulating layer 24, the nitrogen-rich layer 26 and the polysilicon layer 28 are then etched to form the stack shown in FIG. 1. After the formation of the stack, an ion implantation process is carried out to dope shallow regions of n-type silicon 32 and p-type silicon 34. The semiconductor device 10 is therefore completed for a CMOS transistor pair of an n-FET 30 and a p-FET 20.

Figure 2:
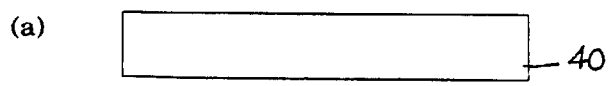
FIG. 2A is an enlarged, cross-sectional view of the present invention semiconducting substrate.
FIG. 2B is an enlarged, cross-sectional view of the present invention semiconducting substrate of FIG. 2A having a gate dielectric layer deposited or grown on top.
FIG. 2C is an enlarged, cross-sectional view of the present invention semiconductor structure of FIG. 2B having a nitrogen and silicon containing diffusion barrier layer deposited on top.
FIG. 2D is an enlarged, cross-sectional view of the present invention semiconductor structure of FIG. 2C having a final gate electrode layer formed on top of the nitrogen and silicon containing diffusion barrier layer.
Figure 2:
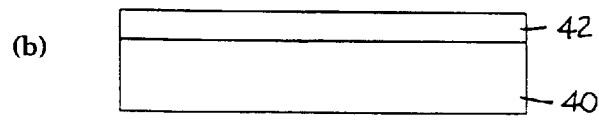
Figure 2:
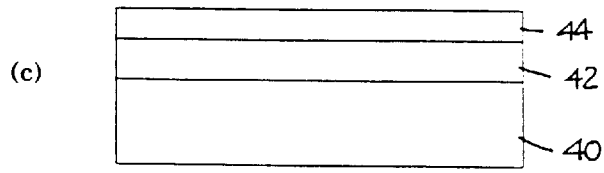
Figure 2:
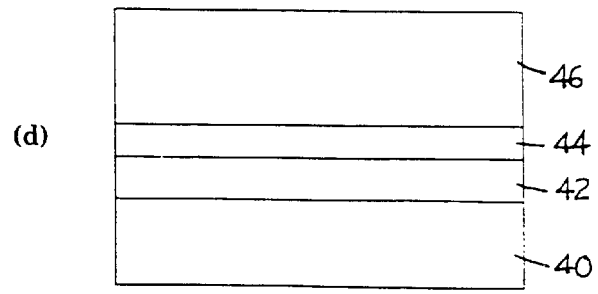

The fabrication details of the present invention nitrogen-rich layer 26 are illustrated below and in appended drawings of FIGS. 2A–2D. As shown in FIG. 2A, a substrate 40 is first provided. The substrate 40 should be formed of a semiconducting material since the present invention nitrogen-rich layer is essentially located in a metal-insulator-semiconductor capacitor structure. The substrate 40 can be advantageously made of doped crystalline silicon or polycrystalline silicon. The substrate 40 may also be formed by any other semiconducting material. In the next fabrication step, as shown in FIG. 2B, a capacitor is fabricated by the deposition or growth of an insulating layer 42 on top of the semiconducting substrate 40. The insulating layer 42 is typically pure silicon dioxide or silicon dioxide that contains a small amount, i.e., smaller than 2 atomic %, of nitrogen. It should be noted that this amount of nitrogen is not adequate to stop the diffusion of chemical species from the gate electrode 28 to the substrate 12. The insulating layer 42 therefore, cannot be utilized as a substitute for the present invention nitrogen-rich layer. It should be noted that the insulating layer 42 does not have to be a homogenous material. Instead, it can be suitably formed of an insulating stack of materials such as silicon dioxide and a metal oxide. It is also possible that the subsequently formed nitrogen-rich layer 44 shown in FIG. 2C, can be used to completely replace the insulating layer 42 as long as the nitrogen-rich layer is insulating.

The present invention novel nitrogen-rich layer 44 can be deposited by a novel method of surface pyrolysis of molecules that contain at least Si and N atoms, but do not contain carbon atoms. Optionally, the nitrogen-rich layer 44 can be altered by reacting it with oxidizing or nitridizing species such as $NH_3$, $N_2H_4$, $O_2$, $N_2O$, NO, etc. The reaction can be conducted either during the deposition with the Si—N containing molecules or can be carried out as a post processing step.

The present invention novel nitrogen-rich layer 44 should only contain nitrogen, silicon, oxygen, and optionally, small amounts of hydrogen. After the nitrogen-rich layer 44 is formed, it acts as an insulator, a semiconductor, or a conductor as determined by its stoichiometry. One of the benefits achievable by the present invention is that the stoichiometry can be completely user-controlled.

The process utilized for producing the structure shown in FIG. 2C involves a low temperature and low pressure chemical vapor deposition (CVD) process for producing a nitrided film, and then a low temperature reaction of the film with a nitridizing and/or oxidizing gas. The present invention novel process therefore can be executed by either one of two methods. It can be executed by two distinct and separate processing steps, or can be executed by CVD and nitrification/oxidation reaction carried out concurrently.

In one preferred embodiment, the present invention deposition process for the nitrogen-rich layer can be carried out by exposing the substrate 40 on which the gate oxide layer 42 is formed to trisilylamine vapor (TSA=$[(SiH_3)_3N]$). A novel feature of the gas molecules of trisilylamine is that they contain only silicon, nitrogen and hydrogen. It is the unique discovery of the present invention method that any other precursor that contains carbon in any form cannot be used for the present invention method since carbon would inevitably be incorporated into the film and therefore degrade the operation of the device. As a result, none of the many silicon-containing organic amines can be used in the present invention novel method. Another novel feature of trisilylamine is that this molecule enables a lower temperature route to the formation of a silicon and nitrogen containing layer via low pressure chemical vapor deposition than any other precursor known.

The present invention novel method can be advantageously performed in a stainless steel cold-wall reactor such that the wall deposition of TSA can be minimized. A commonly used quartz tube hot wall LPCVD furnace could serve equally well, but would require the standard practice of removing the deposited material from the sides of the tube on a regular basis. The TSA gas pressure can be suitably chosen in the range between about 1 m Torr and about 500 Torr, while the substrate can be heated to a temperature in the range between about 400° C. and about 900° C. Formation of the nitrogen-rich film by the present invention novel method to a suitable thickness, i.e., 5–100 Å can be normally achieved in 5 minutes, depending on the pressure and temperature employed.

The final step in the fabrication of the present invention capacitor is the deposition of a conducting layer 46 on top of the nitrogen-rich layer 44. This is shown in FIG. 2D. The conducting layer 46 can be composed of doped or intrinsic polysilicon, or any other conducting material which contains chemical species that could degrade the performance or lifetime of the semiconductor device if they were to diffuse through the insulating layer into the substrate.

Figure 3:
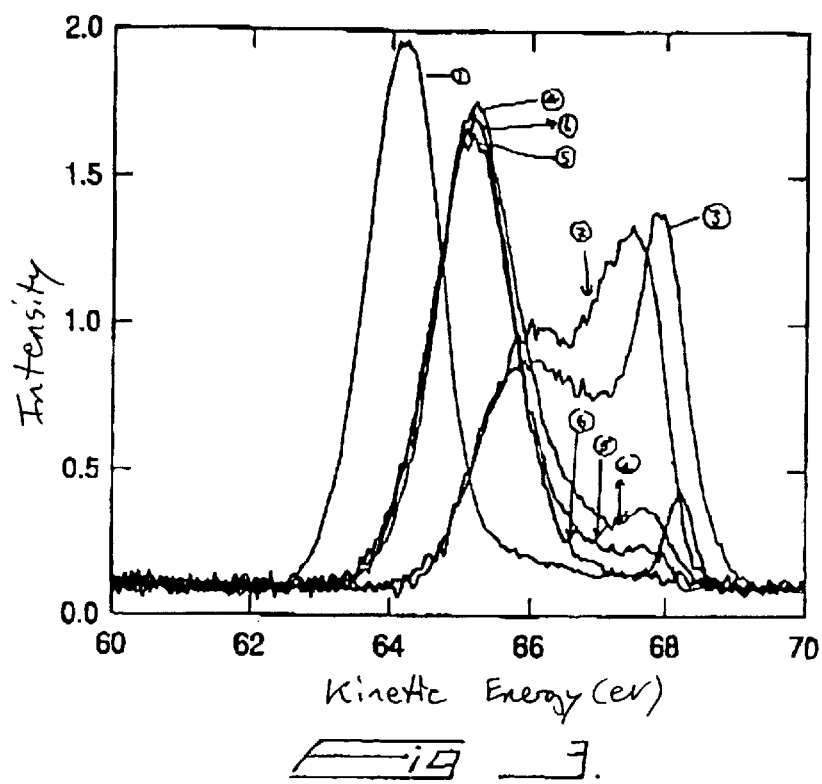
FIGS. 3 and 4 are graphs illustrating X-ray photoemission data obtained on present invention devices during various stages of preparation.
Figure 4:
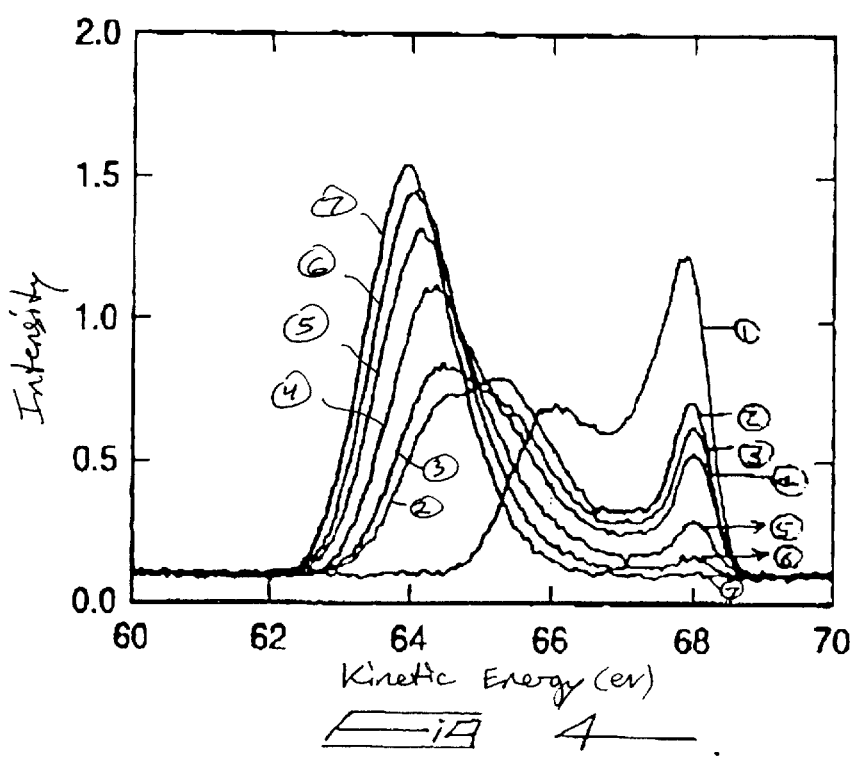

The chemical nature of the present invention novel nitrogen-rich film can be verified by an X-ray photoemission test and furthermore, can be illustrated by the X-ray photoemission spectra shown in FIGS. 3 and 4. The graph shown in FIG. 3 contains six traces each representing X-ray photoemission data of the layer after each processing step. The traces directly show the bonding configurations of the silicon atoms within the layer. The traces were obtained after performing a deposition such as previously described on a silicon substrate coated with a thin, previously grown nitrided oxide layer. The thickness of the nitrided oxide layer will always be less than 10 nm, and in one preferred embodiment is approximately 1.0 nm. A thin nitrided oxide layer is specifically chosen in this experiment in order to show the maximum effect which the chemical manipulations that are performed on the overlayer have on the oxide/ substrate interface. It has been found that the thinner the nitrided oxide layer is, the more vulnerable its interface with the substrate will be to chemical effect by the post processing of the deposited overlayer.

Referring now to FIG. 3, trace 1 was obtained on a silicon substrate after the growth of approximately 10 Å silicon dioxide. The large peak at 64 eV is from the oxide film, while the smaller peak at 68 eV shows the presence of a pure silicon substrate under the film. After deposition of the nitrogen-containing film, which was accomplished by pyrolysis of trisilylamine vapor on the surface of the oxide at 515° C., trace 2 was obtained. At this point of the process, the TSA layer contains approximately 25 atomic % nitrogen due to the stoichiometry of the particular precursor used and thus the film is fairly conductive. When the TSA layer is thick enough, i.e., larger than 25 Å, the signals from the oxide and the substrate underneath are completely attenuated. However, it is possible to observe the signal from the oxide layer underneath if the TSA layer is made thin enough. Trace 2 shows a peak characteristic of silicon with no direct bonding to nitrogen, as well as a feature characteristic of Si—N bond formation. This spectrum, along with the intensity of the N 1s XPS spectrum, indicates that the stoichiometry of the nitrogen-containing film is approximately $Si_3N$.

In one preferred embodiment of the present invention, approximately three monolayers of the nitrogen-rich film are used to provide an effective barrier to boron diffusion. If it is necessary to make the nitrogen-containing film insulating, it could be oxidized or subjected to further nitridation. The thickness of the nitrogen-rich film shown in FIG. 3, trace 2, of approximately 50 Å is substantially larger than would be required in the actual implementation of the present invention method. A thicker film was specially chosen for this demonstration, as it requires more stringent conditions for conversion to a stoichiometric nitride, since the stoichiometric nitride formed at the surface of the nitrogen-rich film serves as a diffusion barrier and thus shields the bottom of the nitrogen-rich film from the nitriding agent. It is therefore demonstrated that an entire nitrogen-rich film of the present invention having an excessive thickness can be transformed to stoichiometric nitride under conditions which do not perturb the stoichiometry of the nitrided oxide/silicon substrate interface. It is therefore concluded that all of the possible post processing reactions which could be used for the nitrogen-rich film will pose no inherent problem. The X-ray photoemission spectra therefore amply demonstrate this effect.

The majority of the 50 Å thick nitrogen-rich film in FIG. 3 is converted to stoichiometric nitride upon reaction with ammonia at a temperature of less than 500° C. This temperature would be sufficient for the preferred embodiment of the process, if only a three monolayer film were used. The 50 Å thick film can be completely transformed to stoichiometric silicon nitride at a temperature of approximately 700° C. However, even this process is insufficient to perturb the original oxide film. It has also been observed that, even subjecting the test structure to the 700° C. $NH_3$ reaction conditions for a prolonged period of time, no additional nitrogen is incorporated into the gate oxide layer underneath. It is therefore concluded that the stoichiometry of the deposited buffer layer can be manipulated without altering the gate insulator layer. It should be further noted that, in addition to nitriding the nitrogen-rich buffer layer, it is also possible to oxidize the film to any desired extent by the use of, for instance, molecular oxygen, $N_2O$ or NO. This can be conducted either in a separate processing step, or concurrently with the deposition of the nitrogen-rich film.

When the sample is annealed to 750° C., i.e., FIG. 3 trace 3, hydrogen is removed from the trisilylamine film. Traces 4, 5 and 6 illustrate that annealing in ammonia at increasing temperatures of 560° C., 630° C. and 690° C., respectively, results in the incorporation of additional nitrogen into the film. As a result, the film is converted to the insulator silicon nitride ($Si_3N_4$). Alternatively, it may be desirable to keep the nitrogen concentration of the film at 25 atomic %, and instead anneal in oxygen. The results obtained by such a method are shown in FIG. 4.

As shown in FIG. 4, wherein trace 1 is equivalent to trace 3 of FIG. 3, trace 1 shows a TSA film deposited at 503° C. after annealing for removal of hydrogen. Traces 2–7 further illustrate TSA films annealed in oxygen at 454° C., 505° C., 566° C., 703° C., 770° C. and 850° C., respectively. Utilizing this process, a silicon oxynitride film can be fabricated without reducing the nitrogen concentration significantly. The silicon oxynitride film has the same diffusion barrier characteristic, in addition to being a good insulating layer.

Figure 5:
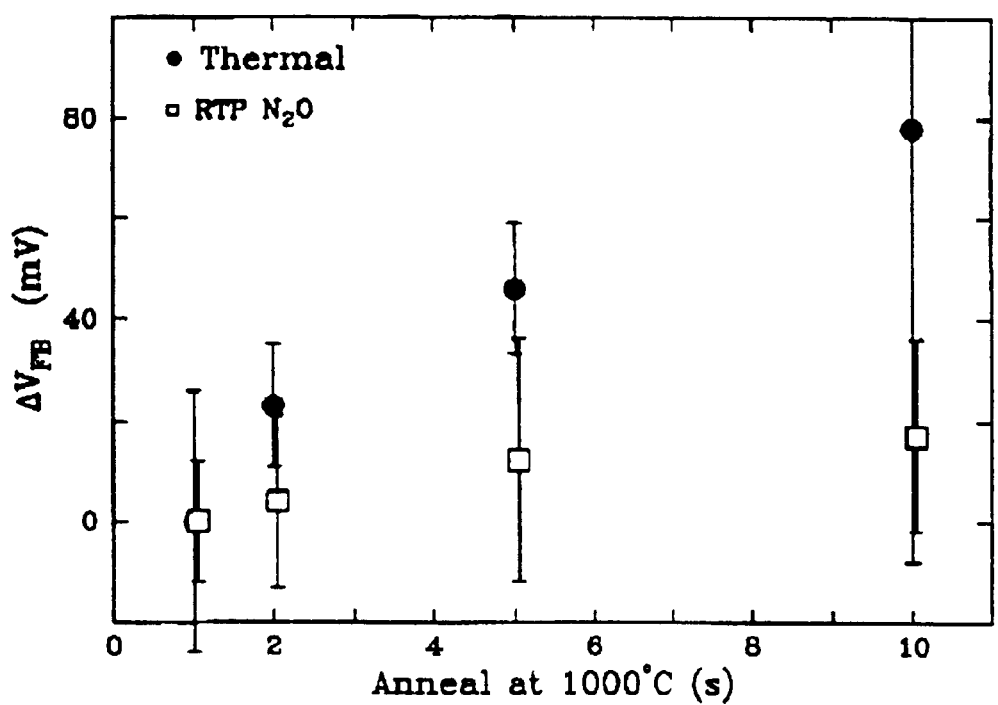
FIG. 5 is a graph illustrating the effect of a nitrided oxide suppressing the diffusion of boron atoms at various annealing temperatures.

An example of how the present invention novel method and structure would prove beneficial is demonstrated in FIG. 5. The presence of nitrogen in the gate oxide of a CMOS FET is used to stop boron atoms which are present in a heavily doped p+ polysilicon gate electrode from diffusing through the gate oxide into the n-type Si substrate. One way to monitor the presence of boron in the substrate is by monitoring the changes in the flatband voltage of a capacitor-like device structure. The flatband voltage (Vfb) is known to be directly proportional to the difference between the workfuncton of the gate and that of the substrate. Since the workfunction of doped Si is primarily determined by the doping concentration, any change in the dopant concentration will be reflected by a change in Vfb. An example of this is shown in FIG. 5, where the change in Vfb is monitored for two different kinds of 35 Å oxides, as a function of annealing time at a given temperature. This annealing process is required for CMOS device manufacture in order to activate the boron atoms that were previously implanted into the polysilicon gate electrode. This figure shows that boron is diffusing through the oxide and into the substrate, causing a change in Vfb. The diffusion of boron occurs to a much lesser extent in the $N_2O$ grown oxide vs. the pure thermal oxide, due to the presence of N atoms blocking the B diffusion. A small change in Vfb is still observed in the $N_2O$ grown oxide, however, since the percentage of N atoms in this layer is quite low. Using the present invention novel method and structure, it would be possible to significantly increase the time or temperature of the boron activation anneal, and at the same time keep the boron atoms completely inside the polysilicon gate electrode.

The advantage and uniqueness offered in our novel structure and method is the precise control of the location of and the N concentration in the N-containing layer. In the example above, nitrogen is added to the oxide via a simple thermal process which allows for little or no control over where the nitrogen is incorporated. Indeed, in the example above, nitrogen is located close to the oxide-substrate interface, where it can adversely affect FET characteristics, such as the initial flatband voltage. Ideally, it is desirable to control the location of the N-containing layer, which is accomplished via the deposition of a N-containing layer on top of a gate oxide, as well as to tailor the N concentration independently, which can be performed via judicious choice of the deposition molecules and conditions.

The present invention novel method and device formed have therefore been amply demonstrated by the above descriptions and the appended drawings of FIGS. 1–5. The present invention novel method solves the problems of the conventional method by providing a low temperature CVD-based process for the deposition of nitrogen-containing layers at the electrode-dielectric interface. When the present invention nitrogen-rich layer is combined with a substrate already possessing a nitrided oxide layer, a greatly improved device can be produced. The nitrogen-rich layer possesses a small amount of nitrogen near the substrate, and a large controllable amount of nitrogen near the gate electrode. For instance, the small amount of nitrogen located near the substrate may be approximately 2 atomic %, while the larger controllable amount of nitrogen near the gate electrode may be approximately 25 atomic %. Since the CVD process can be conducted at low temperatures, it does not cause a redistribution of the nitrogen previously incorporated in the oxide near the substrate interface. The present invention novel method therefore enables the two different functions of the introduced nitrogen to be optimized independently.

The present invention novel basic structure embodied in the preferred embodiment has been shown in FIG. 2D. The novel feature consists of a thin nitrogen-containing silicon layer that is inserted between a gate dielectric layer and a gate electrode, for blocking diffusion of contaminating species from the electrode into the dielectric. The novel diffusion barrier layer can be fabricated advantageously by a chemical vapor deposition method. The diffusion barrier layer can be as thin as one or two atomic layers, or can be increased as required. Even though the structure depicted in FIG. 2D has a superficial similarity to a so-called "stacked gate dielectric" device, the function of, and the typical width envisioned for, the deposited layer put it in an entirely different category. For instance, in a stacked gate structure, a stoichiometric silicon nitride layer is typically of similar thickness to the silicon dioxide layer in the gate insulator, and both make substantial contributions to the total capacitance of the gate dielectric. In contrary, the present invention novel diffusion barrier layer is intended only to minimally impact the total capacitance of the gate dielectric, while intended primarily for the purpose of blocking impurity diffusion into the oxide and substrate.

While the present invention has been described in an illustrative manner, it should be understood that the terminology used is intended to be in a nature of words of description rather than of limitation.

Furthermore, while the present invention has been described in terms of a preferred and an alternate embodiments, it is to be appreciated that those skilled in the art will readily apply these teachings to other possible variations of the inventions. For example, a nitrogen-containing layer for the purpose of blocking the diffusion of contaminants could be used in static random access memory (SRAM), dynamic random access memory (DRAM), synchronous dynamic random access memory (SDRAM), flash electrically eraseable programable read only memory (EEPROM) and charge coupled devices (CCD) as well as in CMOS FETs.

The embodiment of the invention in which an exclusive property or privilege is claimed are defined as follows:

1. A method for forming a layer of material on a substrate comprising the steps of;
   providing a substrate,
   heating the substrate to a temperature not less than 400° C., and
   flowing a gas which has silicon and nitrogen atoms in the same molecule and is without carbon and fluorine over a surface of said substrate at a sub-atmospheric pressure forming a layer of material containing only Si, N, O and H on said surface, said layer of material that contains only Si, N, O and H has a nitrogen content of not more than 25 atomic percent.

2. A method for forming a layer of nitrogen-containing material according to claim 1 further comprising the step of flowing a gas comprising nitrogen-containing molecules at a pressure of not higher than 500 Torr.

3. A method for forming a layer of nitrogen-containing material according to claim 2 further comprising the step of flowing a gas comprising nitrogen-containing molecules at a pressure between about 1 m Torr and about 500 Torr.

4. A method for forming a layer of nitrogen-containing material according to claim 2 further comprising the step of heating the substrate to a temperature between about 400° C. and about 900° C.

5. A method for forming a layer of nitrogen-containing material according to claim 2 wherein nitrogen-containing molecules pyrolize and react at said surface forming said layer of nitrogen-containing material.

6. A method for forming a layer of nitrogen-containing material according to claim 2, wherein nitrogen and silicon containing molecules pyrolize and react at said surface forming said layer of nitrogen and silicon containing material on said surface.

7. A method for forming a layer of nitrogen-containing material according to claim 2, wherein gas comprising nitrogen-containing molecules is flowed over a surface of said substrate in a chemical vapor deposition process.

8. A method for forming a layer of nitrogen-containing material according to claim 2, wherein said gas which has a silicon and nitrogen atoms in the same molecule is flowed over a surface of said substrate in a chemical vapor deposition process.

9. A method for forming a layer of nitrogen-containing material according to claim 2 further comprising the step of flowing a gas of $(SiH_3)_3N$ over the surface of said substrate.

10. A method for forming a layer of nitrogen-containing material according to claim 2, wherein nitrogen-containing molecules contain pendant groups of $SiH_3$.

11. A method for forming a layer of nitrogen-containing material according to claim 2, wherein nitrogen-containing molecules contain nitrogen covalently bonded to $SiH_3$.

12. A method for forming a layer of nitrogen-containing material according to claim 2, wherein said substrate is selected from the group consisting of crystalline silicon, polycrystalline silicon, amorphous silicon, silicon germanium alloy, silicon dioxide or other dielectric materials and substrates covered with a dielectric material.

13. A method for forming a layer of material containing only Si, N, O and H on a substrate comprising the steps of:
   providing a substrate maintained at a temperature not less than 400° C.,
   forming a silicon oxide layer containing less than 2 at. % nitrogen on said substrate, and
   flowing a gas which has silicon and nitrogen atoms in the same molecule over a surface of said silicon oxide layer at a pressure of not higher than 500 Torr, said molecules being without carbon such that said layer of material containing only Si, N, O and H has a first amount of nitrogen adjacent to said silicon oxide layer and a second amount of nitrogen adjacent to an opposite surface of said layer of material containing only Si, N, O and H is formed on said surface of said silicon oxide layer, said second amount being different than said first amount.

14. A method for forming a layer of nitrogen and silicon containing material on a substrate according to claim 13 further comprising the step of providing a substrate maintained at a temperature between about 400° C. and about 900° C.

15. A method for forming a layer of nitrogen and silicon containing material on a substrate according to claim 13 further comprising the step of flowing a gas which has silicon and nitrogen atoms in the same molecule at a pressure between about 1 m Torr and about 500 m Torr.

16. A method for forming a layer of nitrogen and silicon containing material on a substrate according to claim 13, wherein said gas has silicon and nitrogen atoms in the same molecule and pyrolizes and reacts at said surface forming said layer of nitrogen and silicon containing material on said surface.

17. A method for forming a layer of nitrogen and silicon containing material on a substrate according to claim 13 further comprising the step of flowing a gas selected from the group consisting of $(SiH_3)_3N$, $SiH_4$, $Si_2H_6$, $Si_2H_2Cl_2$, $NH_3$, $NO$, $N_2O$, $N_2H_4$ and $O_2$.

18. A method for forming a layer of nitrogen and silicon containing material on a substrate according to claim 13 further comprising the step of flowing a gas of $(SiH_3)_3N$ (trisilylamine) over the surface of said substrate.

19. A method for forming a layer of nitrogen and silicon containing material on a substrate according to claim 13, wherein said gas has silicon and nitrogen atoms in the same molecule and is flowed over the surface of said substrate in a chemical vapor deposition process.

20. A method for forming a layer of nitrogen and silicon containing material on a substrate according to claim 13, wherein said nitrogen and silicon containing molecules further contain pendant groups of $SiH_3$.

21. A method for forming a layer of nitrogen and silicon containing material on a substrate according to claim 13, wherein said nitrogen and silicon containing molecules further contain nitrogen covalently bonded to $SiH_3$.

22. A method for forming a layer of nitrogen and silicon containing material on a substrate according to claim 13, wherein said substrate is selected from the group consisting of crystalline silicon, polycrystalline silicon, amorphous silicon, silicon germanium alloy, silicon dioxide or other dielectric materials and substrates covered with a dielectric material.

23. A method for forming a layer of nitrogen and silicon containing material on a substrate according to claim 13 further comprising the step of forming a nitrided oxide layer on said substrate prior to said gas flowing step.

24. A method for forming a layer of nitrogen and silicon containing material on a substrate according to claim 13 further comprising the step of forming a nitrided oxide layer to a thickness of less than 10 nm on said substrate prior to said gas flowing step.

25. A method for forming a layer of nitrogen and silicon containing material on a substrate according to claim 13 further comprising the step of reacting said layer of nitrogen and silicon containing material with ammonia and thereby converting said material to stoichiometric nitride.

26. A method for forming a layer of nitrogen and silicon containing material on a substrate according to claim 13 further comprising the step of reacting said layer of nitrogen and silicon containing material with ammonia at a temperature less than 700° C. and converting said material to stoichiometric nitride.

27. A method for forming a layer of nitrogen and silicon containing material on a substrate according to claim 13 further comprising the step of reacting said layer of nitrogen and silicon containing material with a material selected from the group consisting of $N_2H_4$, $O_2$, $N_2O$ and $NO$.

* * * * *